United States Patent
Kim et al.

(10) Patent No.: US 9,306,188 B2
(45) Date of Patent: Apr. 5, 2016

(54) ORGANIC LIGHT EMITTING DIODE DISPLAY

(71) Applicant: SAMSUNG DISPLAY CO., LTD., Yongin, Gyeonggi-Do (KR)

(72) Inventors: Min Seop Kim, Cheonan-si (KR); Hwan Jin Kim, Hwaseong-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 14/290,966

(22) Filed: May 29, 2014

(65) Prior Publication Data

US 2015/0108439 A1 Apr. 23, 2015

(30) Foreign Application Priority Data

Oct. 17, 2013 (KR) .................... 10-2013-0124226

(51) Int. Cl.
*H01L 51/52* (2006.01)
*H01L 27/32* (2006.01)
*H01L 51/00* (2006.01)

(52) U.S. Cl.
CPC .......... *H01L 51/5256* (2013.01); *H01L 27/323* (2013.01); *H01L 27/3272* (2013.01); *H01L 51/524* (2013.01); *H01L 51/5237* (2013.01); *H01L 51/0097* (2013.01); *H01L 2251/5338* (2013.01)

(58) Field of Classification Search
CPC .................. H01L 2251/5338; H01L 51/0096; H01L 51/0097; H01L 51/52; H01L 51/5237
USPC ......... 257/100, 40, 414, 428, 437; 438/26, 99
See application file for complete search history.

(56) References Cited

U.S. PATENT DOCUMENTS

| | | | | |
|---|---|---|---|---|
| 7,348,964 B1 * | 3/2008 | Gettemy | ............... | G06F 1/1626 178/18.01 |
| 7,781,850 B2 * | 8/2010 | Miles | ................... | B81B 3/0086 257/414 |
| 7,826,006 B2 * | 11/2010 | Koganezawa | ..... | G02F 1/133611 349/56 |
| 7,920,223 B2 * | 4/2011 | Nishizawa | ........ | G02F 1/133308 349/58 |
| 8,348,467 B2 * | 1/2013 | Khan | ........................ | F21K 9/52 362/254 |
| 8,853,941 B2 * | 10/2014 | Jung | ..................... | G06F 1/1637 313/504 |
| 2002/0027636 A1 * | 3/2002 | Yamada | ............ | G02F 1/133305 349/155 |

(Continued)

FOREIGN PATENT DOCUMENTS

KR 10-0965251 B1 6/2010
KR 10-2012-0079672 A 7/2012

*Primary Examiner* — Stephen W Smoot
*Assistant Examiner* — Edward Chin
(74) *Attorney, Agent, or Firm* — Lewis Roca Rothgerber Christie LLP

(57) ABSTRACT

An organic light emitting diode display having a flat region having a flat surface, and curved regions disposed at left and right sides of the flat region and formed in curved surfaces, having a display panel including a substrate, which maintains a flat surface in the flat region, and is formed in curved surfaces in the curved regions, and organic light emitting diodes disposed on the substrate, a window disposed in the flat region and the curved regions on the display panel, and a cover member disposed under the display panel, in which the cover member includes a flat cover member disposed in the flat region and curved cover members disposed in the curved regions, and the flat cover member and the curved cover member are formed of different materials or have different thicknesses.

12 Claims, 4 Drawing Sheets

(56) References Cited

U.S. PATENT DOCUMENTS

| | | | | |
|---|---|---|---|---|
| 2002/0105789 | A1* | 8/2002 | Chen | H01L 23/3128 361/767 |
| 2002/0180712 | A1* | 12/2002 | Sato | G06F 13/04 345/173 |
| 2006/0273304 | A1* | 12/2006 | Cok | H01L 51/0096 257/40 |
| 2007/0146569 | A1* | 6/2007 | Nouchi | G02B 6/0088 349/58 |
| 2009/0279241 | A1* | 11/2009 | Gettemy | G06F 1/1601 361/679.26 |
| 2013/0002133 | A1* | 1/2013 | Jin | G06F 1/169 313/511 |
| 2013/0020747 | A1 | 1/2013 | Kumagai | |
| 2014/0002973 | A1* | 1/2014 | Lee | H05K 7/00 361/679.01 |
| 2014/0002975 | A1* | 1/2014 | Lee | H05K 5/0017 361/679.01 |
| 2014/0345791 | A1* | 11/2014 | Son | B32B 37/0046 156/228 |

* cited by examiner

ORGANIC LIGHT EMITTING DIODE DISPLAY

CROSS-REFERENCE TO RELATED APPLICATION

This application claims priority to and the benefit of Korean Patent Application No. 10-2013-0124226 filed in the Korean Intellectual Property Office on Oct. 17, 2013, the entire contents of which are incorporated herein by reference.

BACKGROUND

1. Field

The present invention relates to an organic light emitting diode display.

2. Description of the Related Art

Recently, lightness and flatness of a monitor, a television, and the like have been demanded, and a cathode ray tube (CRT) has been substituted with a liquid crystal display (LCD) according to the demand. However, the liquid crystal display, which is a light receiving element, requires a separate backlight, and has limitations in response speed, viewing angle, and the like.

As a display device capable of overcoming the aforementioned limitations, an organic light emitting device, which is a self-emitting display element, has advantages of a wide viewing angle, excellent contrast, and a fast response time and therefore has greatly attracted attention.

In the meantime, a flexible organic light emitting diode display has a flat portion and a curved portion. The curved portion is formed in a curved surface having a curvature, so that tolerance may be generated in the curved portion compared to the flat portion when a product is assembled.

The above information disclosed in this Background section is only for enhancement of an understanding of the background of the invention and therefore it may contain information that does not form the prior art that is already known to a person of ordinary skill in the art.

SUMMARY

Embodiments of the present invention has been made in an effort to provide an organic light emitting diode display having the ability of absorbing tolerance of a curved portion when an organic light emitting diode display including the curved portion is assembled. An exemplary embodiment of the present invention provides an organic light emitting diode display having a flat region maintaining a flat surface, and curved regions disposed at left and right sides of the flat region and formed in curved surfaces, including: a display panel including a substrate, which maintains a flat surface in the flat region, and is formed in curved surfaces in the curved regions, and organic light emitting diodes disposed on the substrate; a window disposed in the flat region and the curved regions on the display panel; and a cover member disposed under the display panel, in which the cover member includes a flat cover member disposed in the flat region and curved cover members disposed in the curved regions, and the flat cover member and the curved cover member are formed of different materials or have different thicknesses.

The cover member may be formed of a cushion or a sponge.

The flat cover member and the curved cover member may have different thicknesses.

The thickness of the curved cover member may be larger than the thickness of the flat cover member by about 1.5 times to about 3 times.

The flat cover member and the curved cover member may be formed of the same material.

The flat cover member and the curved cover member may be formed of different materials.

A density of the flat cover member may be larger than a density of the curved cover member by about 3 times to about 10 times.

The flat cover member and the curved cover member may have the same thickness.

The organic light emitting diode display according to an exemplary embodiment of the present invention may further include a touch panel disposed between the display panel and the window.

The touch panel may be disposed in the flat region and the curved regions.

The curved regions may be disposed to be extended from the flat region.

The flat region and the curved regions may display an image.

According to exemplary embodiments of the present invention, the cover member disposed under the display panel may include the flat cover member and the curved cover members formed of different materials or having different thicknesses, thereby absorbing tolerance in a curved portion when the organic light emitting diode display including the curved portion is assembled.

DETAILED DESCRIPTION

Figure 1:
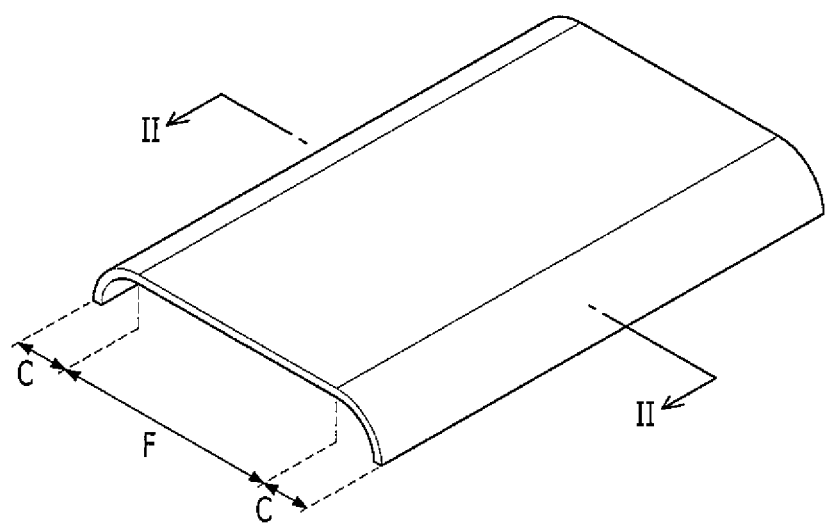
FIG. 1 is a perspective view schematically illustrating an organic light emitting diode display according to an exemplary embodiment of the present invention.

Exemplary embodiments of the present invention will be described in detail with reference to the accompanying drawings. As those skilled in the art would realize, the described embodiments may be modified in various different ways, all without departing from the spirit or scope of the present invention. On the contrary, exemplary embodiments introduced herein are provided to make disclosed contents thorough and complete and sufficiently transfer the spirit of the present invention to those skilled in the art.

In the drawings, the thickness of layers and regions are exaggerated for clarity. It will be understood that when a layer is referred to as being "on" another layer or substrate, it can be directly on the other layer or substrate, or intervening layers may also be present. Like reference numerals designate like components throughout the specification.

FIG. 1 is a perspective view schematically illustrating an organic light emitting diode display according to an exemplary embodiment of the present invention.

Referring to FIG. 1, an organic light emitting diode display 1000 according to an exemplary embodiment of the present invention includes a flat region F and curved regions C disposed at left and right sides of the flat region F. The flat region F and the curved regions C display an image.

The flat region F substantially maintains a flat surface, and may serve as a main display screen of the organic light emitting diode display 1000.

The curved regions C are disposed to be extended from the flat region F, and are formed in a curved surface having a predetermined radius curvature. The curved regions C may serve as sub display screens of the organic light emitting diode display 1000.

As described above, the organic light emitting diode display 1000 according to the present exemplary embodiment includes the flat region F maintaining a flat surface, and the curved regions C extended from the flat region F and formed in a curved surface having the predetermined radius curvature, so that the display screen of the organic light emitting diode display 1000 is not limited to the flat region F, and is extended to the curved regions C to be viewed by a user. That is, an entire display screen of the organic light emitting diode display 1000 may be increased by the curved regions C.

Further, in instances where the organic light emitting diode display 1000 according to the present exemplary embodiment is a portable type, a feeling of holding, that is, a grip feeling, of the organic light emitting diode display 1000 may be improved by the curved regions C.

Next, a structure of the organic light emitting diode display according to the exemplary embodiment of the present invention will be described with reference to FIGS. 2 and 3.

Figure 2:
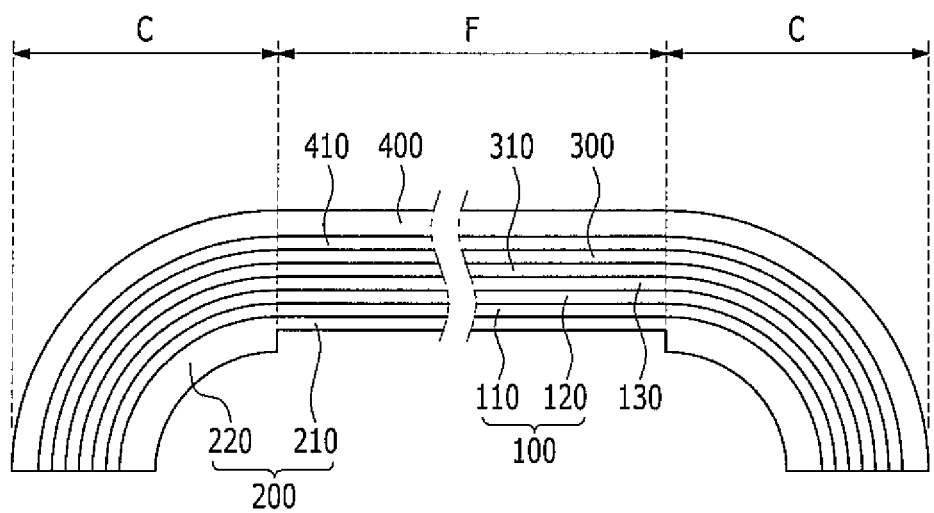
FIG. 2 is a cross-sectional view taken along line II-II of FIG. 1.
Figure 3:
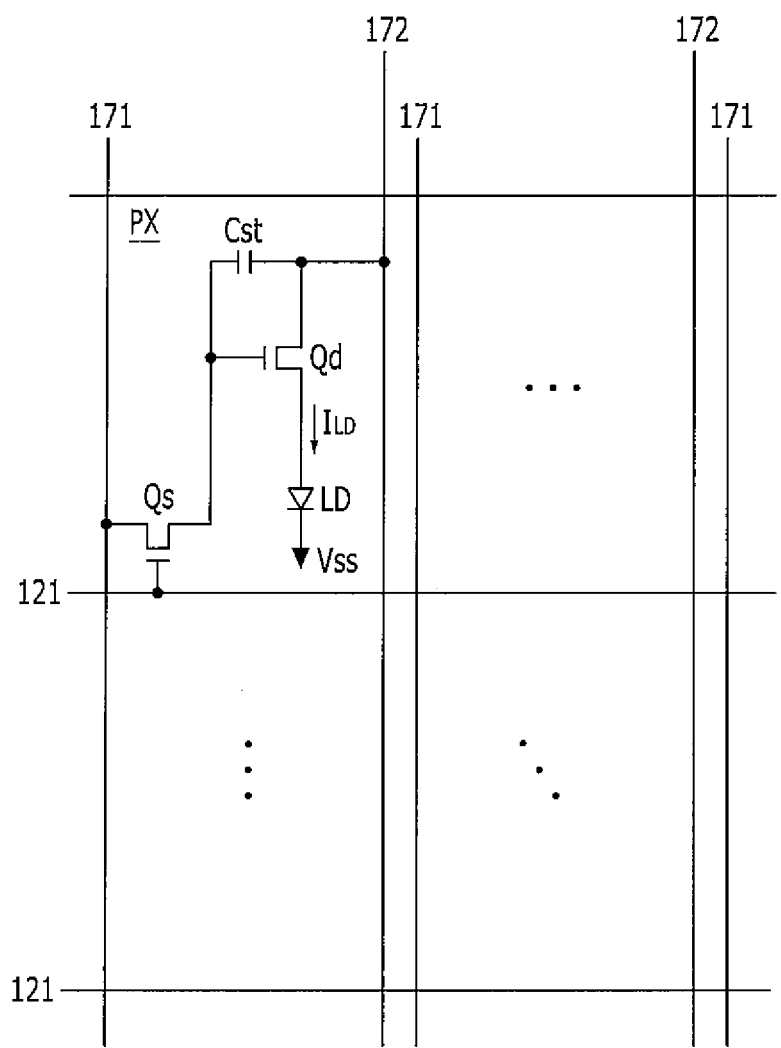
FIG. 3 is an equivalent circuit diagram of the organic light emitting diode display of FIG. 1.

FIG. 2 is a cross-sectional view taken along line II-II of FIG. 1, and FIG. 3 is an equivalent circuit diagram of the organic light emitting diode display of FIG. 1.

Referring to FIG. 2, the organic light emitting diode display 1000 includes a display panel 100, a polarization plate 130, a touch panel 300, and a window 400 sequentially disposed on the display panel 100.

Further, the organic light emitting diode display 1000 according to the present exemplary embodiment includes a cover member 200 attached under the display panel 100.

The display panel 100 includes a substrate 110 and a thin film layer 120 disposed on the substrate 110.

The substrate 110 is a flexible substrate, and may be formed of a plastic material having heat resistance and durability, such as polyethylene naphthalate (PEN), polycarbonate (PC), polyarylate (PAR), polyether imide (PEI), polyether sulfone (PES), and polyimide (PI). Further, the substrate 110 is not limited thereto, and may be formed of various materials having flexibility.

The substrate 110 maintains a flat surface in the flat region F, and is formed in a curved surface in the curved region C. Because the substrate 110 is a flexible substrate, the substrate 110 may be formed in a curved surface in the curved region C.

The thin film layer 120 includes a plurality of organic light emitting diodes emitting light. Further, the thin film layer 120 includes a plurality of thin film transistors connected to the organic light emitting diodes, and a plurality of gate lines and a plurality of data lines connected to the thin film transistors. Further, the thin film layer 120 may further include color filters displaying red, blue, and green.

Here, the organic light emitting diodes are disposed in the flat region F and the curved regions C, so that an image is displayed in the flat region F and the curved regions C.

Next, the organic light emitting diode display according to the exemplary embodiment of the present invention will be described in detail through an equivalent circuit diagram of the organic light emitting diode display including the organic light emitting diodes.

Referring to FIG. 3, the organic light emitting diode display according to an exemplary embodiment includes a plurality of signal lines 121, 171, and 172, and a plurality of pixels connected to the plurality of signal lines 121, 171, and 172 and approximately arranged in a matrix form.

The signal line includes a plurality of gate lines 121 transferring a gate signal (or a scan signal), a plurality of data lines 171 transferring a data signal, and a plurality of driving voltage lines 172 transferring a driving voltage. The gate lines 121 extend substantially in a row direction and are almost parallel to each other, and the data lines 171 and the driving voltage lines 172 extend substantially in a column direction and are almost parallel to each other.

Each pixel PX includes a switching transistor Qs, a driving transistor Qd, a storage capacitor Cst, and an organic light emitting diode LD.

The switching transistor Qs has a control terminal, an input terminal, and an output terminal, and the control terminal is connected to the gate line 121, the input terminal is connected to the data line 171, and the output terminal is connected to the driving transistor Qd. The switching transistor Qs transfers a data signal applied to the data line 171 to the driving transistor Qd in response to a scan signal applied to the gate line 121.

The driving transistor Qd also has a control terminal, an input terminal, and an output terminal, and the control terminal is connected to the switching transistor Qs, the input terminal is connected to the driving voltage line 172, and the output terminal is connected to the organic light emitting diode LD. The driving transistor Qd outputs an output current $I_{LD}$ having a size change according to a voltage between the control terminal and the output terminal.

The capacitor Cst is connected between the control terminal and the input terminal of the driving transistor Qd. The capacitor Cst charges a data signal applied to the control terminal of the driving transistor Qd, and maintains the charged data signal even after the switching transistor is turned off.

The organic light emitting diode LD has an anode connected to the output terminal of the driving transistor Qd and a cathode connected to a common voltage Vss. The organic light emitting diode LD emits light by changing intensity of light according to the output current $I_{LD}$ of the driving transistor Qd, thereby displaying an image.

The switching transistor Qs and the driving transistor Qd are an n-channel field effect transistor (FET). However, at least one of the switching transistor Qs and the driving transistor Qd may be a p-channel field effect transistor. Further, a connection relationship between the transistors Qs and Qd, the capacitor Cst, and the organic light emitting diode LD may be changed.

Referring back to FIG. 2, the polarization plate 130 is disposed on the display panel 100, and the touch panel 300 is disposed on the polarization plate 130.

A user writes or draws characters or pictures or executes an icon by contacting a finger or a touch pen (stylus) onto the touch panel 300, so that the touch panel 300 allows a desired command to be performed.

The polarization plate 130 and the touch panel 300 have flexibility, and are disposed in the flat region F and the curved regions C. The touch panel 300 is attached to the polarization plate 130 through a touch panel adhesive layer 310. Further, the touch panel 300 may be omitted.

The window 400 for protecting the touch panel 300 and the display panel 100 from impact from the outside and inflow of foreign substances and supporting the touch panel 300 and the display panel 100 is disposed on the touch panel 300. The window 400 is attached to the touch panel 300 through a window adhesive layer 410. The window 400 is transparent, and has transmittance at a level at which an image displayed on the display panel 100 is transmittable well.

The window 400 is disposed in the flat region F and the curved regions C. That is, the window 400 maintains a curved shape in the curved region C. Accordingly, the window 400 serves as a supporting means for supporting so that the display panel 100 and the touch panel 300 maintain the curved shape in the curved region C.

A cover member 200 is disposed under the display panel 100. The cover member 200 may be attached to the display panel 100 through an adhesive.

The cover member 200 buffers external impact when the external impact is applied to the display panel 100, so as to protect the display panel 100, and is made of a material, which may contain air to absorb impact, such as a cushion or a sponge.

The cover member 200 includes a flat cover member 210 and curved cover members 220 formed of different materials or having different thicknesses.

In the present exemplary embodiment, the thicknesses of the flat cover member 210 and the curved cover member 220 are different from each other, and the materials of the flat cover member 210 and the curved cover member 220 are the same as each other. The flat cover member 210 is disposed in the flat region F, and the curved cover member 220 is disposed in the curved region C.

Here, the thickness of the curved cover member 220 is larger than the thickness of the flat cover member 210 by about 1.5 times to about 3 times.

In the curved region C, the display panel 100, the polarization plate 130, the touch panel 300, and the window 400 are formed with a curved surface having a curvature, so that tolerance may be generated when the organic light emitting diode display is assembled, and the curved cover member 220 is formed to be thicker than the thickness of the flat cover member 210 by about 1.5 times to about 3 times, thereby absorbing the tolerance when the organic light emitting diode display is assembled.

Further, the flat cover member 210 is formed to be thinner than the curved cover member 220, thereby preventing a thickness of the organic light emitting diode display 1000 from being thicker in the flat region F.

A case (not shown) for accommodating and supporting the display panel 100 may also be disposed under the cover member 200.

As described above, the cover member 200 including the flat cover member 210 and the curved cover members 220 having different thicknesses is attached under the display panel 100, thereby achieving an effect of protecting the display panel 100 from external impact and absorbing tolerance when the organic light emitting diode display is assembled.

Next, an organic light emitting diode display according to another exemplary embodiment of the present invention will be described with reference to FIG. 4.

Figure 4:
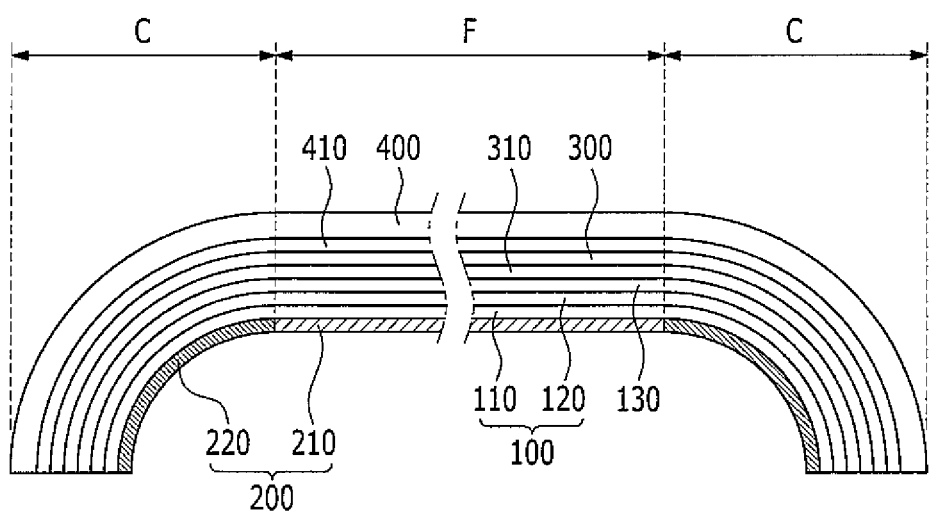
FIG. 4 is a cross-sectional view illustrating a cross-section of an organic light emitting diode display according to another exemplary embodiment of the present invention.

FIG. 4 is a cross-sectional view illustrating a cross-section of an organic light emitting diode display according to another exemplary embodiment of the present invention.

Referring to FIG. 4, in comparison with the organic light emitting diode display illustrated in FIG. 2, the organic light emitting diode display according to the present exemplary embodiment is different from the organic light emitting diode display illustrated in FIG. 2 with respect to a shape of cover member 200, but has the same remaining structures as those of the organic light emitting diode display illustrated in FIG. 2. Accordingly, descriptions of the same structures will be omitted.

Cover member 200 is disposed under a display panel 100. The cover member 200 may be attached to the display panel 100 through an adhesive.

The cover member 200 buffers external impact when the external impact is applied to the display panel 100 to protect the display panel 100, and is made of a material, which contains air to absorb impact, such as a cushion or a sponge.

The cover member 200 includes a flat cover member 210 and curved cover members 220 formed of different materials or having different thicknesses.

In the present exemplary embodiment, the materials of the flat cover member 210 and the curved cover member 220 are different from each other, and the thicknesses of the flat cover member 210 and the curved cover member 220 are the same as each other. The flat cover member 210 is disposed in a flat region F, and the curved cover member 220 is disposed in a curved region C.

Here, density of the flat cover member 210 is larger than a density of the curved cover member 220 by about 3 times to about 10 times.

The density of the curved cover member 220 is smaller than the density of the flat cover member 210, so that the curved cover member 220 may be free to be formed in a curved surface in the curved region C.

In the curved region C, the display panel 100, a polarization plate 130, a touch panel 300, and a window 400 are formed in the curved surface having a curvature, so that tolerance may be generated when the organic light emitting diode display is assembled, and the density of the curved cover member 220 is smaller than the density of the flat cover member 210, so that it is possible to absorb the tolerance when the organic light emitting diode display is assembled.

A case (not shown) for accommodating and supporting the display panel 100 may also be disposed under the cover member 200.

While this invention has been described in connection exemplary embodiments thereof, it is to be understood that the invention is not limited to the disclosed embodiments, but, on the contrary, is intended to cover various modifications and equivalent arrangements included within the spirit and scope of the appended claims.

| Description of symbols | |
| --- | --- |
| 100: Display panel | 110: Substrate |
| 120: Thin film layer | 200: Cover member |
| 210: Flat cover member | 220: Curved cover member |
| 300: Touch panel | 400: Window |

What is claimed is:

1. An organic light emitting diode display having a flat region having a flat surface, and curved regions disposed at left and right sides of the flat region and formed in curved surfaces, comprising:
    a display panel including a substrate having a flat surface in the flat region, and curved surfaces in the curved regions, and organic light emitting diodes disposed on the substrate;
    a window disposed on a top side of the display panel, the window comprising a flat window surface on the flat surface of the display panel and curved window surfaces on the curved surfaces of the display panel; and
    a cover member disposed on a bottom side of the display panel such that the display panel is disposed between the window and the cover member,
    wherein the cover member includes a flat cover member disposed in the flat region and curved cover members disposed in the curved regions, and wherein the flat cover member is formed from a first material having a first density and at least one of the curved cover members is formed from a second material having a second density less than the first density.

2. The organic light emitting diode display of claim 1, wherein at least one selected from the flat cover member and the curved cover members is formed of a cushion or a sponge.

3. The organic light emitting diode display of claim 1, wherein the flat cover member and the curved cover member are formed of different materials.

4. The organic light emitting diode display of claim 2, wherein the first density of the flat cover member is larger than the second density of the at least one of the curved cover members by about 3 times to about 10 times.

5. The organic light emitting diode display of claim 4, wherein the flat cover member and the curved cover members have the same thickness.

6. The organic light emitting diode display of claim 1, further comprising a touch panel disposed between the display panel and the window.

7. The organic light emitting diode display of claim 6, wherein the touch panel is disposed in the flat region and the curved regions.

8. The organic light emitting diode display of claim 1, wherein the curved regions extend from the flat region.

9. The organic light emitting diode display of claim 8, wherein the flat region and the curved regions are configured to display an image.

10. An organic light emitting diode display having a flat region having a flat surface, and curved regions disposed at left and right sides of the flat region and formed in curved surfaces, comprising:

a display panel including a substrate having a flat surface in the flat region, and curved surfaces in the curved regions, and organic light emitting diodes disposed on the substrate;

a window disposed on a top side of the display panel, the window comprising a flat window surface on the flat surface of the display panel and curved window surfaces on the curved surfaces of the display panel; and a cover member disposed on a bottom side of the display panel such that the display panel is disposed between the window and the cover member, wherein the cover member includes a flat cover member disposed in the flat region and curved cover members disposed in the curved regions, and wherein the flat cover member has a first thickness measured along a direction normal to the flat cover member and each of the curved cover members has a second thickness larger than the first thickness measured along a direction normal to respective ones of the curved cover members.

11. The organic light emitting diode display of claim 10, wherein the second thickness of each of the curved cover members is larger than the first thickness of the flat cover member by about 1.5 times to about 3 times.

12. The organic light emitting diode display of claim 11, wherein the flat cover member and the curved cover member are formed of the same material.

\* \* \* \* \*